(12) United States Patent
Mathieu et al.

(10) Patent No.: US 12,259,412 B2
(45) Date of Patent: Mar. 25, 2025

(54) SURGE PROTECTION DEVICE INTEGRATING A CURRENT MEASUREMENT SENSOR

(71) Applicant: CITEL, Sevres (FR)

(72) Inventors: Vincent Mathieu, Sevres (FR); Dirk Schneider, Sevres (FR)

(73) Assignee: CITEL, Sevres (FR)

( * ) Notice: Subject to any disclaimer, the term of this patent is extended or adjusted under 35 U.S.C. 154(b) by 56 days.

(21) Appl. No.: 17/844,123

(22) Filed: Jun. 20, 2022

(65) Prior Publication Data

US 2022/0404399 A1   Dec. 22, 2022

(51) Int. Cl.
| | | |
|---|---|---|
| *G01R 19/00* | (2006.01) | |
| *G01R 15/18* | (2006.01) | |
| *G01R 19/165* | (2006.01) | |
| *H02H 3/10* | (2006.01) | |

(52) U.S. Cl.
CPC ....... *G01R 19/0092* (2013.01); *G01R 15/181* (2013.01); *G01R 19/16533* (2013.01); *G01R 19/16571* (2013.01); *H02H 3/105* (2013.01)

(58) Field of Classification Search
CPC ... G01R 19/0092; G01R 15/181; H02H 3/105
See application file for complete search history.

(56) References Cited

U.S. PATENT DOCUMENTS

| | | | | |
|---|---|---|---|---|
| 5,621,309 A | * | 4/1997 | Feldman | G01R 31/1236 324/72 |
| 2013/0314083 A1 | | 11/2013 | Loglisci | |
| 2015/0311697 A1 | * | 10/2015 | Faxvog | H02H 7/04 361/35 |
| 2015/0349523 A1 | * | 12/2015 | Tsovilis | H01T 1/16 361/56 |
| 2018/0330908 A1 | * | 11/2018 | Vrhunc | H01H 85/04 |

FOREIGN PATENT DOCUMENTS

| | | |
|---|---|---|
| DE | 10 2005 049873 A1 | 4/2007 |
| EP | 2 667 205 A1 | 11/2013 |
| EP | 3 016 115 A1 | 5/2016 |
| EP | 3 713 022 A1 | 9/2020 |

OTHER PUBLICATIONS

French Search Report, Opinion from French Priority Application No. 2106481 dated Feb. 17, 2022.

* cited by examiner

*Primary Examiner* — Scott Bauer
(74) *Attorney, Agent, or Firm* — Blank Rome LLP

(57) ABSTRACT

The invention relates to a surge protection device intended to be installed on an electrical installation, in parallel with one or more items of equipment to be protected, said electrical installation comprising at least one first phase line (L1), a neutral line (N) and an earth line (T), the protection device comprising a casing; and a current measurement toroid, which is housed in the casing and which comprises a central opening, through which a detection portion passes that is disposed in a surge current diversion path.

17 Claims, 7 Drawing Sheets

SURGE PROTECTION DEVICE INTEGRATING A CURRENT MEASUREMENT SENSOR

CROSS REFERENCE TO RELATED APPLICATIONS

This application claims priority of French Application No. 2106481 filed on Jun. 18, 2021. The entire contents of that application are incorporated herein by reference.

TECHNICAL FIELD

The invention relates to the field of surge protection devices.

More specifically, the invention relates to a surge protection device associated with a monitoring device, which comprises a current measurement sensor for delivering a signal representing the surge current diverted by the protection device, the monitoring device being configured to provide information relating to the surge currents diverted by the surge protection device as a function of the signal delivered by the current measurement sensor.

Technological Background

In order to protect electrical equipment against transient surges, which may have different sources such as lightning or industrial disturbances, for example, the use of surge protection devices is known.

The surge protection devices are intended to be disposed upstream and in parallel with the equipment to be protected. They use protection elements with the particular feature of having, in the normal state, high impedance and of becoming conductive when they undergo a surge above a certain threshold, which is higher than the normal operating voltage of the equipment to be protected. The protection elements thus allow the surges to be diverted.

Furthermore, the use of monitoring devices is also known for delivering information concerning the surge currents that are diverted by the protection device. The monitoring devices comprise a current measurement sensor, such as a current measurement toroid that is positioned around a conductor connecting the protection device to earth. The current measurement toroid delivers a voltage proportional to the derivative of the current flowing through the conductor passing through the current measurement toroid. The current measurement toroid is connected to a signal processing unit that integrates the delivered signal and that is thus configured to deliver one or more items of information concerning the surge currents, in particular the number, amplitude and time thereof. Indeed, it may be worthwhile precisely estimating the number and the features of the surge currents, in order to trigger a check for checking the equipment to be protected, in order to organize preventive maintenance operations (such as the replacement of protection elements before they fail, for example) or even in order to improve the surge protection strategy.

However, as the current measurement toroid and the protection device are two separate elements each housed in different casings, the assembly has a significant footprint. In addition, the installation of the current measurement toroid requires additional assembly operations.

SUMMARY

Thus, one idea behind the invention is to propose a protection device and a current measurement toroid that are associated with each other and that are simple to install and are less bulky.

According to one embodiment, the invention provides a surge protection device intended to be installed on an electrical installation, in parallel with one or more items of equipment to be protected, said electrical installation comprising at least one first phase line, a neutral line and an earth line, the protection device comprising:
a casing;
at least one first and one second busbar, which are housed in the casing;
at least one first and one second connection terminal, which are housed in the casing and are respectively connected to the first and the second busbars and are respectively intended to be connected to the neutral line and the earth line of the electrical installation;
at least one first protection module connecting the first busbar and the second busbar, the first protection module being configured to divert a surge current from the neutral line to the earth line, or vice versa;
a current measurement toroid, which is housed in the casing and which comprises a central opening, through which a detection portion passes that forms part of one from among the first and the second busbars, said detection portion being disposed in a surge current diversion path running from the first connection terminal to the second connection terminal.

Thus, the current measurement toroid is directly integrated into the casing of the surge protection device, which allows, on the one hand, the footprint of the assembly to be limited and, on the other hand, its installation to be facilitated.

According to embodiments, such a surge protection device can comprise one or more of the following features.

According to one embodiment, the first protection module comprises only one gas discharge arrester.

According to one embodiment, the detection portion forms part of the first busbar.

According to one embodiment, the detection portion is located between a zone of the first busbar electrically connected to the first protection module and a zone of the first busbar electrically connected to the second protection module.

According to one embodiment, the current measurement toroid comprises a Rogowski coil. Such a current measurement toroid allows a reliable indication to be provided of the amplitude of surges diverted to earth by the surge protection device.

According to one embodiment, the current measurement toroid comprises an annular support defining an annular casing around the central opening and a coil housed in the housing of the annular support.

According to one embodiment, the annular support comprises a first part and a second part attached together by attachment components, the first and second parts respectively comprising a first slot and a second slot dimensioned to allow the passage of the detection portion. This allows the current measurement toroid to be positioned by passing the detection portion through the two parts of the annular support.

According to one embodiment, the first part comprises an annular bottom and an outer wall and an inner wall projecting from the bottom towards the second part, the inner wall and the outer wall defining, with the bottom, the housing, the first slot passing through the bottom, the outer wall and the inner wall, the second part comprising an annular flange covering the housing, the second slot passing through the annular flange.

According to one embodiment, the first annular portion comprises two lugs, which project from the annular flange towards the first part and which respectively insert into portions of the first slot that are provided in the inner wall and in the outer wall of the first part.

According to one embodiment, the first slot and the second slot are angularly offset from each other.

According to one embodiment, the coil is formed by a wire successively forming a first terminal, an incomplete toroidal helical portion extending between a first end and a second end separated from each other by a space allowing the passage of the detection portion, a return portion, which extends from the second end of the helical portion and passes inside the helical portion to the first end of said helical portion and a second terminal. This facilitates the installation of the coil around the detection portion.

According to one embodiment, the annular support comprises a wall positioned in the housing between the first end and the second end of the helical portion of the coil.

According to one embodiment, the return portion is housed in an insulating sheath.

According to one embodiment, the coil comprises a first terminal and a second terminal, which are connected to a printed circuit that is housed in a space provided in the annular support.

According to one embodiment, the annular support comprises a hollow base defining the space in which the printed circuit is housed.

According to one embodiment, the first part of the annular support comprises a hollow base defining the space in which the printed circuit is housed, with the second part of the annular support comprising a second portion facing the hollow base of the first part so as to close the space accommodating the printed circuit.

According to one embodiment, the second busbar is connected to the second protection module by a soldered joint.

According to one embodiment, the surge protection device further comprises:
  a third busbar, which is housed in the casing;
  a third connection terminal, which is housed in the casing, is connected to the third busbar and is intended to be connected to the first phase line of the electrical installation; and
  a second protection module connecting the third busbar to the first busbar, the second protection module being configured to divert a surge current from the first phase line to the earth line or to the neutral line, or vice versa.

According to one embodiment, the first and second protection modules comprise one or more protection elements selected from among gas discharge arresters, air discharge arresters, varistors, Transient-Voltage-Suppression (TVS) diodes and thyristor surge suppressors.

According to one embodiment, the second protection module comprises a gas discharge arrester and a varistor in series.

According to one embodiment, the second protection module is detachably plugged into the casing.

According to one embodiment, the protection device further comprises a fourth and a fifth busbar housed in the casing and a fourth and a fifth connection terminal, which are respectively connected to the fourth and to the fifth busbars and are respectively intended to be electrically connected to a second and a third phase line, the device further comprising a third and a fourth protection module, the third protection module connecting the fourth busbar to the first busbar and the fourth protection module connecting the fifth busbar to the first busbar, the fourth and the fifth protection modules respectively being configured to divert a surge current from the second phase line to the earth line or the neutral line and from the third phase line to the earth line or the neutral line, or vice versa.

According to one embodiment, the third and fourth protection modules are detachably plugged into the casing.

According to one embodiment, the third and fourth protection modules comprise a gas discharge arrester and a varistor in series.

According to one embodiment, the casing comprises a front part and a rear part, the rear part comprising attachment elements, configured to attach the protection device to a cabinet of the electrical installation that is equipped with a set of bars comprising at least three busbars respectively connected to the first phase line, to the neutral line and to the earth line, the rear part comprising openings each accommodating one of the first, second and third connection terminals so as to allow each of said first, second and third connection terminals to be pressed against one of the busbars.

According to one embodiment, the casing comprises a front part equipped with an external connector, which is connected to the current measurement toroid.

According to a second aspect, the invention also relates to an assembly comprising an aforementioned surge protection device and a monitoring device, which is connected by a cable to the external connector of the surge protection device, the monitoring device being configured to process a signal delivered by the current measurement toroid and to deliver one or more items of surge-related information selected from the number, the amplitude, the duration and the time of surges diverted by the surge protection device.

BRIEF DESCRIPTION OF THE FIGURES

The invention will be better understood, and further aims, details, features and advantages thereof will become more clearly apparent, throughout the following description of several particular embodiments of the invention, which are provided solely by way of a non-limiting illustration, with reference to the accompanying drawings.

DESCRIPTION OF THE EMBODIMENTS

Figure 1:
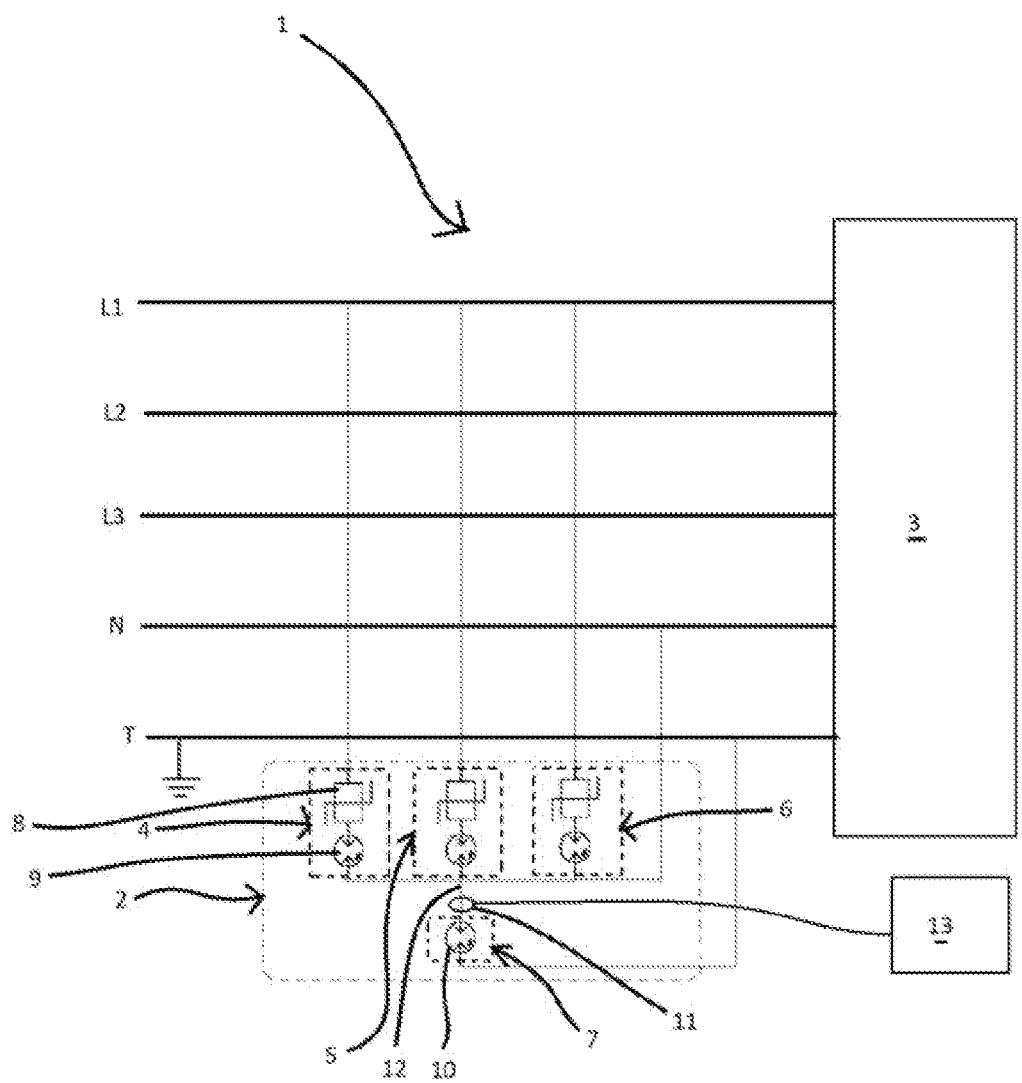
FIG. 1 is a schematic diagram of an electrical installation equipped with a surge protection device integrating a current measurement sensor.
Figure 2:
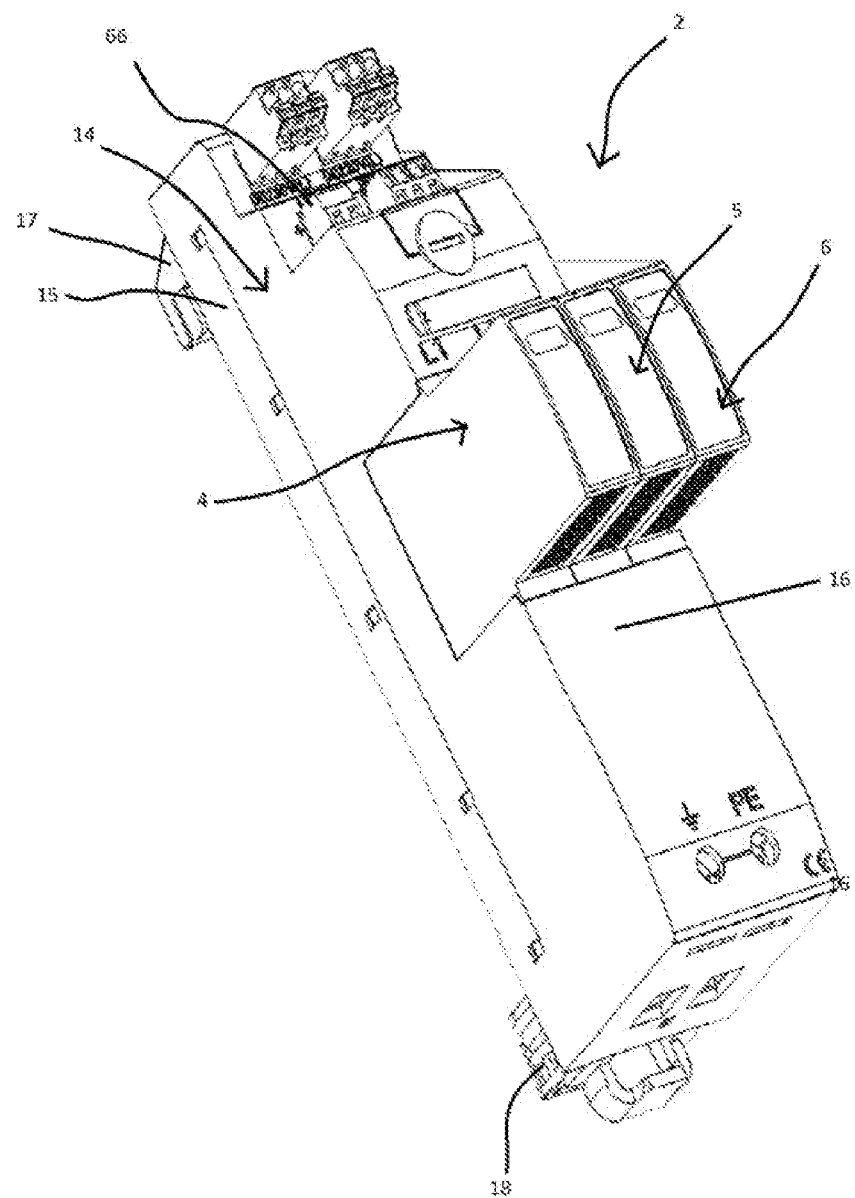
FIG. 2 is a front perspective view of a surge protection device.

FIG. 1 is a schematic illustration of a low-voltage electrical installation 1 equipped with a surge protection device 2. The protection device 2 is installed in parallel with and upstream of the equipment to be protected 3.

In FIG. 1, the electrical installation 1 is a three-phase installation and therefore comprises three phase lines L1, L2, L3, a neutral line N and an earth line T. However, according to another alternative embodiment, not shown, the electrical installation 1 is a single-phase installation and therefore comprises only one phase line L1. In this case, the number and the arrangement of the protection modules 4, 5, 6, 7 described hereafter are adapted accordingly.

In the embodiment shown, the protection device 2 comprises three protection modules 4, 5, 6, which are each inserted between one of the phase lines L1, L2, L3 and the neutral line N. The protection device 2 also comprises a protection module 7 between the neutral line N and the earth line T. Such a protection device 2 can thus eliminate surges: in common mode, between phase or neutral and earth and in differential mode, between two phases or between a phase and neutral. According to another embodiment, not shown, the protection device is only inserted between the neutral line N and the earth line T and therefore comprises only one protection module.

Each protection module 4, 5, 6, 7 comprises one or more protection elements selected from among gas discharge arresters, air discharge arresters, varistors, surge suppressor diodes and thyristor surge suppressors. When a protection module 4, 5, 6, 7 undergoes a voltage lower than an activation voltage, it acts as a high impedance element so that no current flows therethrough. By contrast, when it undergoes a voltage higher than the activation voltage, the protection module 4, 5, 6, 7 acts as a quasi-zero impedance element so as to divert the surge to earth.

By way of an example, according to the embodiment shown, each of the protection modules 4, 5, 6 that is inserted between one of the phase lines L1, L2, L3 and the neutral line N comprises a varistor 8 and a gas discharge arrester 9 in series. The advantage of the gas discharge arrester 9 is that it has no leakage current as long as it is not initiated, whereas a varistor 8 has a leakage current of the order of a few tens or hundreds of microamperes, which makes it age prematurely. However, the disadvantage of the gas discharge arrester 9 is that it can only be switched off when the "follow-on" current passing through it is low enough, so that it is not impossible for a gas discharge arrester 9 to remain initiated when it is not coupled with a varistor 8. Thus, the combination of a varistor 8 and a gas discharge arrester 9 is particularly advantageous in that it allows the leakage current in the protection module 4, 5, 6 to be limited, while reliably ensuring that the protection module 4, 5, 6 returns to a high-impedance state after the surge has passed.

In the example shown, the protection module 7, which is inserted between the earth line T and the neutral line N, for its part comprises only one gas discharge arrester 10. Indeed, this protection module 7 does not require a varistor since, in such an arrangement, there is no risk of the gas discharge arrester 10 remaining initiated after the surge has passed.

The composition of each of the protection modules 4, 5, 6, 7 is described above solely by way of an example only and can vary according to the contemplated application.

Furthermore, the protection device 2 comprises a current measurement sensor and, more specifically, a current measurement toroid 11. The current measurement toroid 11 is positioned around a portion 12 of the electrical circuit of the protection device 2, which is positioned on the path for diverting surge currents between each of the phase lines L1, L2, L3 and the neutral line N and the earth line T. In the embodiment shown, the current measurement toroid 11 is positioned between the neutral line N and the protection module 7, which is disposed between the neutral line N and the earth line T. However, according to another alternative embodiment, the current measurement toroid 11 also can be positioned between the protection module 7 and the earth line T.

The current measurement sensor 11 is directly integrated into the surge protection device 2, which allows the footprint of the assembly to be limited and its installation to be facilitated.

According to an advantageous embodiment, the current measurement toroid 11 is a Rogowski coil. A Rogowski coil comprises turns that are evenly distributed around a toroidal-shaped support. The Rogowski coil has an air core and is therefore not disrupted by eddy currents in the core as is the case for current measurement toroids with an iron core. The current passing through the portion 12 of the electrical circuit, around which the Rogowski coil is disposed, generates a magnetic field that produces a voltage across the coil that is proportional to the derivative of the current.

The terminals of the current measurement toroid 11 are connected to a monitoring device 13. The monitoring device 13 comprises a signal processing unit, which is configured to process the signal delivered by the current measurement toroid 11 and to deliver one or more items of information relating to the surge currents diverted by the protection device 2, such as the number of surge currents, their amplitude, their duration and their time. According to one embodiment, the monitoring device 13 comprises a screen for displaying one or more of the aforementioned items of information. The monitoring device 13 can also comprise a warning device that is configured to emit a warning signal when the number of surge currents, their amplitude and/or their duration exceeds a threshold value.

FIGS. 2 to 5 show a protection device 2 according to one embodiment corresponding to the diagram of FIG. 1.

The protection device 2 comprises a casing 14 comprising a rear part 15 and a front part 16 and together defining an internal space. The rear part 15 comprises attachment elements 17, 18, shown in FIGS. 2 to 4, configured to attach the protection device 2 to a cabinet, not shown, of an electrical installation. The cabinet is equipped with a set of bars comprising five busbars respectively connected to the three phase lines L1, L2, L3, to the neutral line N and to the earth line T.

Figure 4:
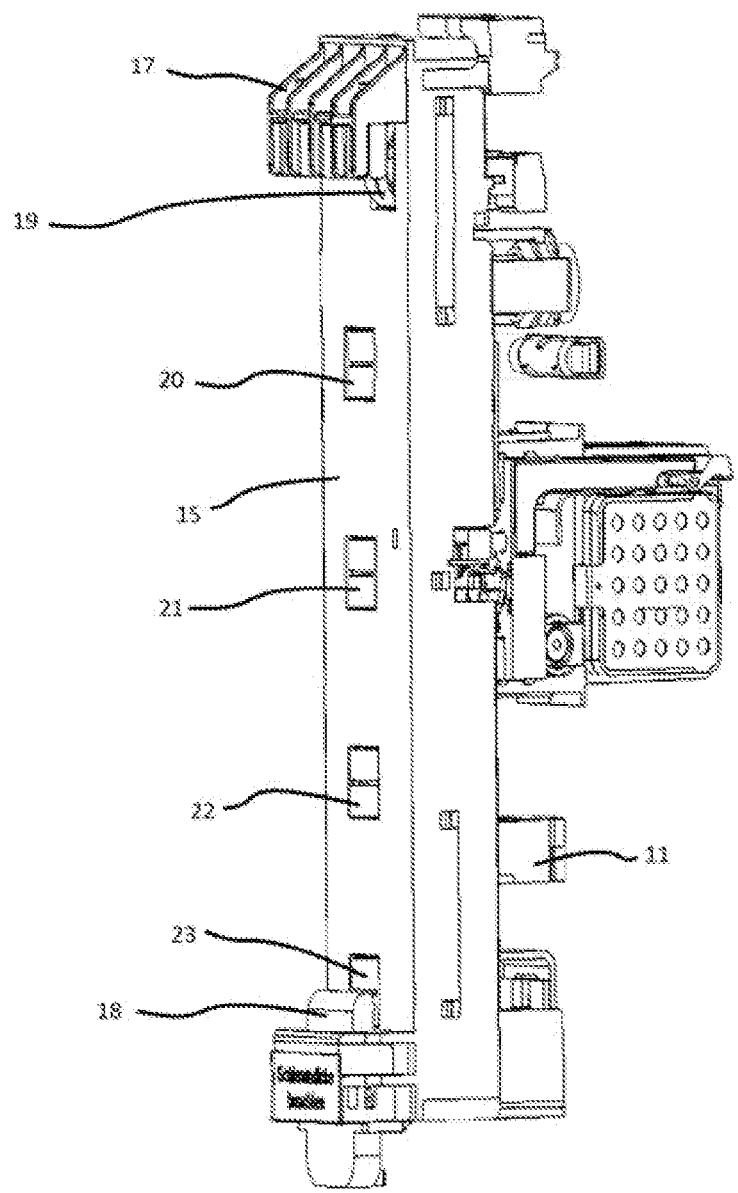
FIG. 4 is a rear perspective view of the protection device shown without the front part of the casing.

The protection device 2 comprises five connection terminals 19, 20, 21, 22, 23, shown in FIG. 4, which are respectively intended to be connected to the three phase lines L1, L2, L3, to the neutral line N and to the earth line T of the electrical installation 1. More specifically, the rear part 15 of the casing 14 comprises five openings each accommodating a connection terminal 19, 20, 21, 22, 23, which is intended to be pressed against one of the five busbars of the cabinet of the electrical installation 1.

Figure 5:
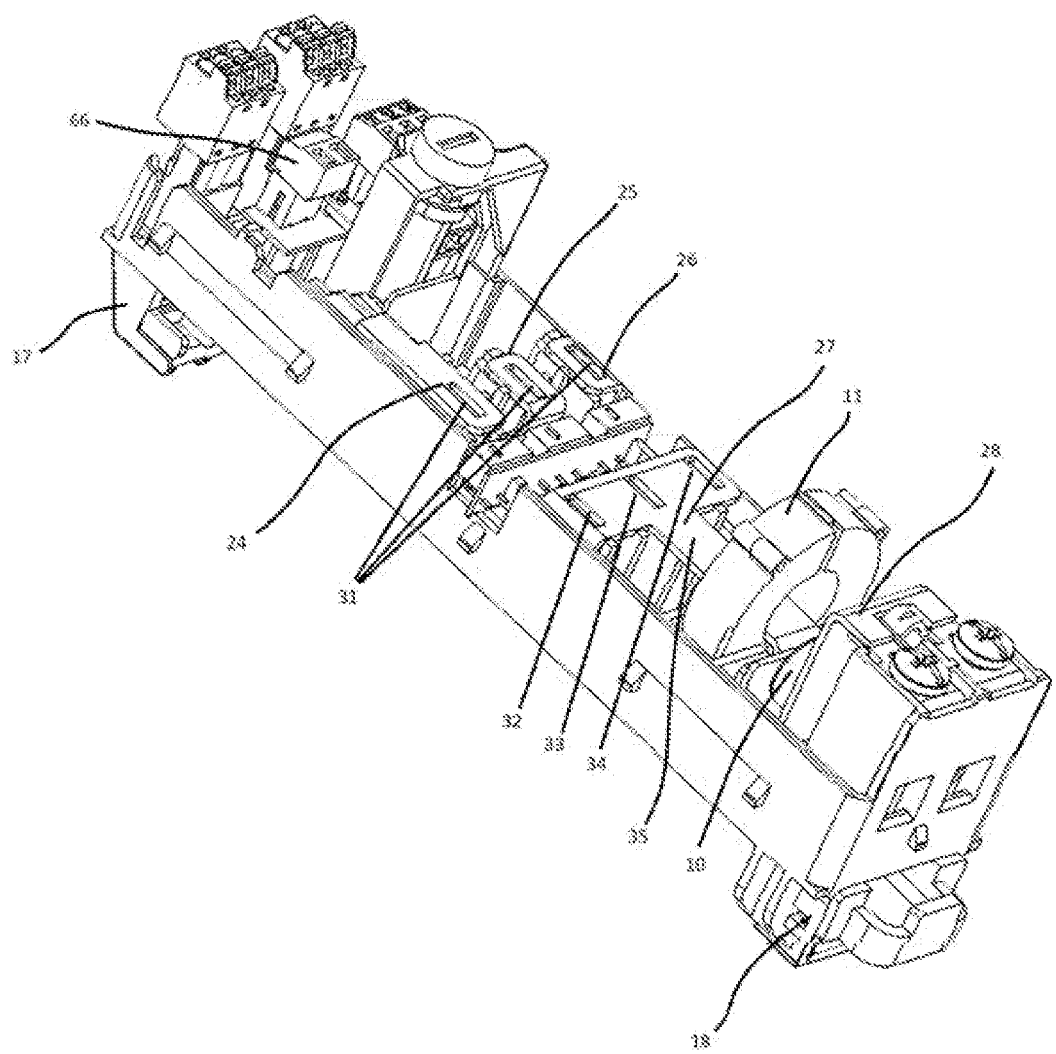
FIG. 5 is a front perspective view of the protection device shown without the front part of the casing nor some of the surge protection modules.

Furthermore, as shown in FIG. 5, the protection device 2 comprises five busbars 24, 25, 26, 27, 28, which are each connected to a respective connection terminal 19, 20, 21, 22, 23. The busbars 24, 25, and 26 are each connected to one of the connection terminals 20, 21, 22 intended to be connected to one of the three phase lines L1, L2, L3. The busbar 27 is connected to a connection terminal 19 intended to be connected to the neutral line N, while the busbar 28 is connected to a connection terminal 23 intended to be connected to the earth line T.

Figure 3:
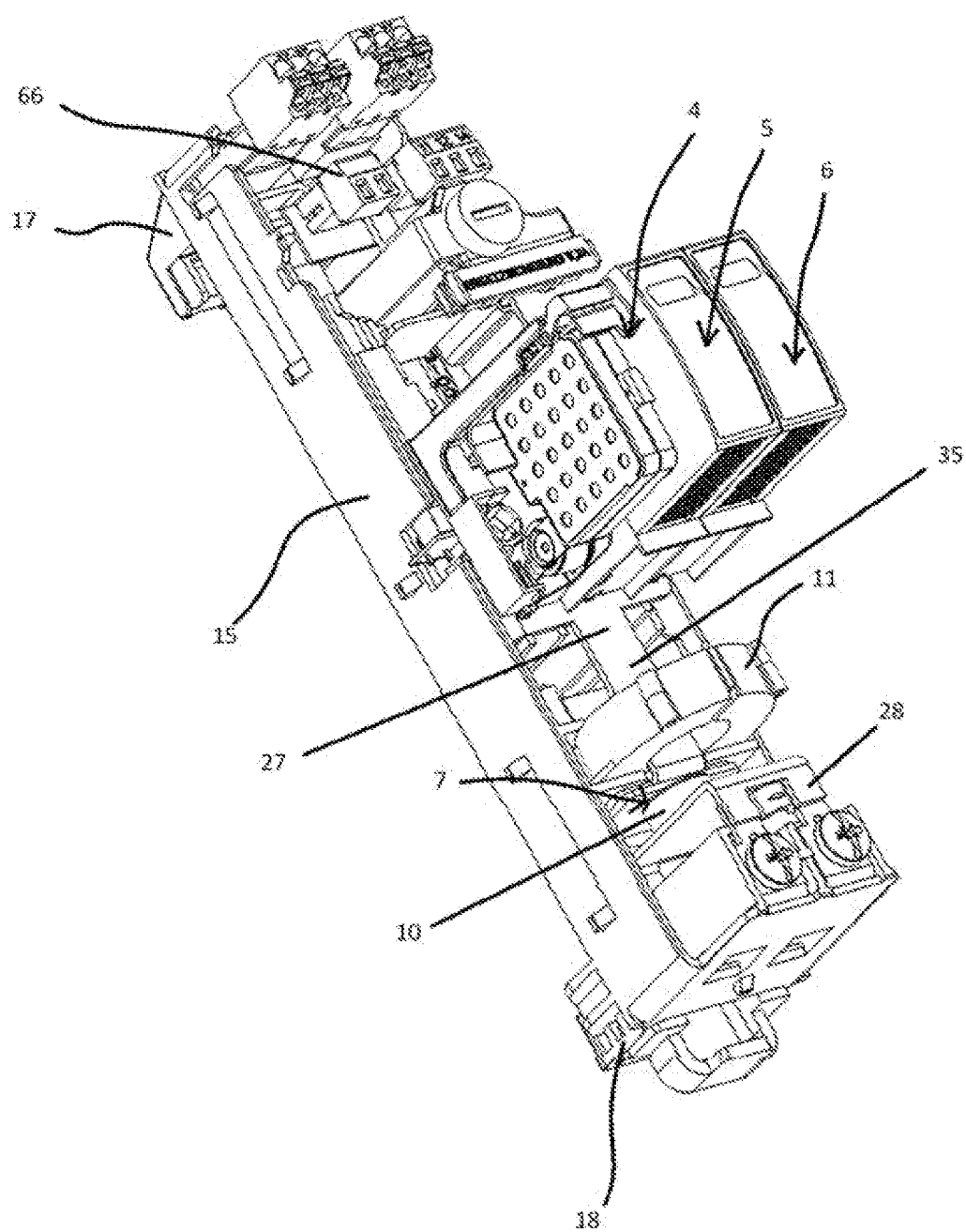
FIG. 3 is a front perspective view of the protection device of FIG. 1, which is shown without the front part of the casing in order to see the components of said protection device.
Figure 6:
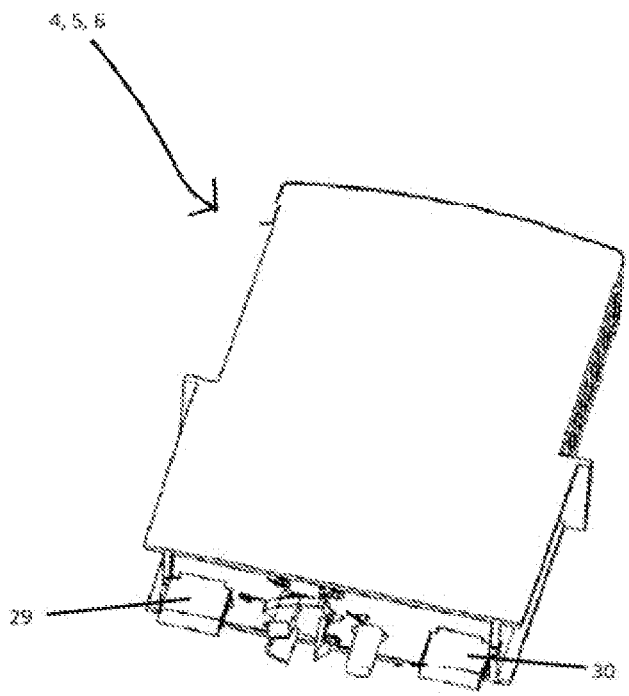
FIG. 6 shows a detachable protection module.

Furthermore, the protection device 2 comprises three protection modules, 4, 5, 6, in particular shown in FIG. 3, which are detachably plugged into the casing 26 of the protection device 2. As shown in FIG. 6, each protection module 4, 5, 6 comprises a plastic case, in which the protection elements and two connection pins 29, 30 are housed, namely a connection pin 29, called phase pin, intended to be electrically connected to one of the phase lines L1, L2, L3 and a connection pin 30, called neutral pin, intended to be electrically connected to the neutral line N. To this end, the phase connection pin 29 of each protection module 4, 5, 6 is intended to be engaged in a hole 31 provided in one of the busbars 24, 25, 26 in order to electrically connect said connection pin 29 to said busbar 24, 25, 26. The neutral connection pin 30 is intended to be engaged in one of the three holes 32, 33, 34 provided in the busbar 27. In accordance with the schematic representation of FIG. 1, each of the three protection modules 4, 5, 6 comprises a gas discharge arrester in series with a varistor. Each protection module 4, 5, 6 also comprises a thermal disconnector, not shown, which allows the protection module 4, 5, 6 to be taken out of service at the end of its life.

Furthermore, a protection module 7 is also inserted between the busbar 27 that is intended to be connected to the neutral line N and the busbar 28 that is intended to be connected to the phase line N. As in the schematic representation of FIG. 1, this protection module 7 comprises only one protection element, namely a gas discharge arrester 10. The gas discharge arrester 10 comprises a first electrode that is electrically connected to the busbar 27 by means of a soldered joint and a second electrode that is electrically connected to the busbar 28 by means of a soldered joint.

Figure 7:
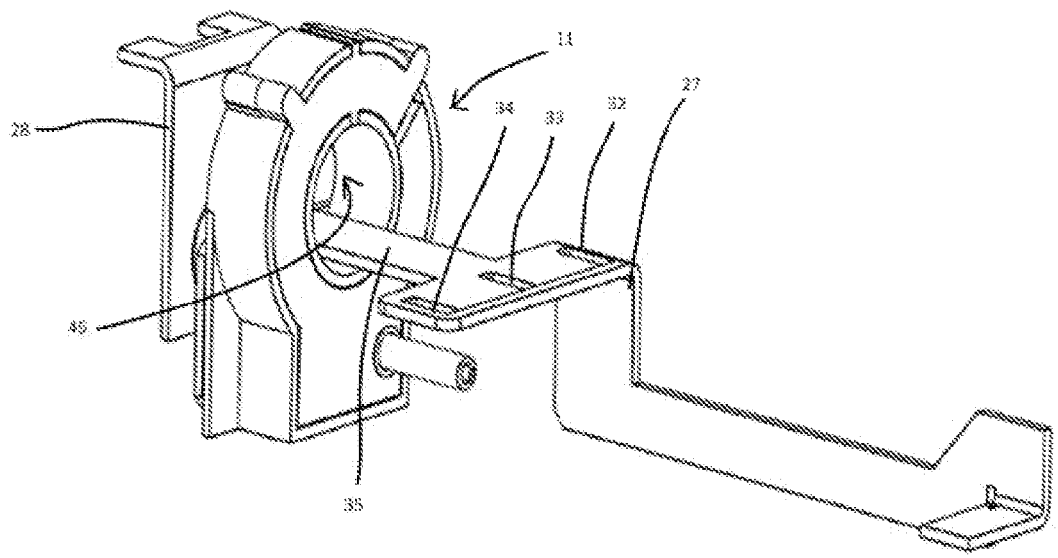
FIG. 7 shows the busbar of the surge protection device that is equipped with the current measurement sensor.

As shown in FIGS. 3 to 5, the protection device 2 comprises a current measurement toroid 11 that is accommodated in the internal space formed between the rear part 15 and the front part 16 of the casing 14. As shown in FIG. 7, the current measurement toroid 11 is mounted around the busbar 27 and, more specifically, around the portion 35 of the busbar 27 that leads to the earth line T via the gas discharge arrester 10.

The current measurement toroid 11 has a central opening 45, through which said busbar 27 is disposed. Advantageously, the current measurement toroid 11 is adapted to be mounted around the busbar 27 by passing said busbar 27 through the various parts of the current measurement toroid 11. Thus, the current measurement toroid 11 can be installed on the busbar 27 after the busbar 27 has been previously attached to the gas discharge arrester 10. This is necessary to the extent that the busbar 27 is attached to the gas discharge arrester 10 using a soldering method involving temperatures that would degrade the current measurement toroid 11.

Figure 8:
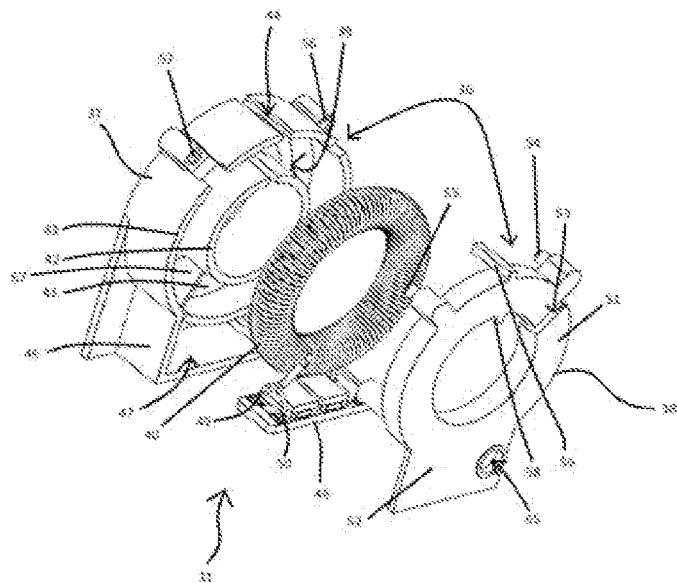
FIG. 8 is an exploded view of the current measurement sensor.

To this end, as shown in FIG. 8, the current measurement toroid 11 comprises an annular support 36 comprising a first part 37 and a second part 38 defining an annular housing 39 around the central opening 45 and a coil 40 housed in the housing 39 of the annular support 36.

The annular support 36 is, for example, made of plastic. The first part 37 comprises an annular bottom 41 positioned around the central opening 45 and an annular inner wall 42 and outer wall 43. The inner wall 42 and the outer wall 43 project from the bottom 41 towards the second part 38 of the casing 14 and define, with the bottom 41, the housing 39 intended to accommodate the coil 40. The first part 37 of the casing 36 comprises a slot 44 that passes through the bottom 41, the inner wall 42 and the outer wall 43. The slot 44 is dimensioned to allow the portion 35 of the busbar 27 to pass through the bottom 41, the inner wall 42 and the outer wall 43 in order to be positioned inside the central opening 45. The first part 37 also comprises, at the bottom, a hollow base 46 defining a space 47 intended to accommodate a printed circuit 48, to which the two terminals 49, 50 of the coil 40 are connected.

The second part 38 comprises an annular flange 51 intended to face the housing 39 of the first part 37 so as to close it, and a second portion 52 intended to face the hollow base 46 of the first part 37 so as to close the space 39 intended to accommodate the printed circuit 48. The second part 38 also comprises a slot 53 allowing the portion 35 of the busbar 27 to pass through the annular flange 51. The slot 53 provided in the second part 38 is advantageously angularly offset relative to the slot 44 provided in the first part 37.

Furthermore, the annular support 36 comprises attachment components 54, 55, 56, 57 for attaching the first part 37 and the second part 38 together. In the embodiment shown, the second part 38 comprises pins 54, 55 intended to fit into housings 56, 57 of the first part 37. Furthermore, the second part 38 advantageously comprises two lugs 58, 59, which project from the annular flange 51 of the second part 38 towards the first part 37 and which are respectively intended to be inserted into the portions of the slot 44 that are provided in the inner wall 42 and in the outer wall 43, which allows them to be sealed and thus limits the passage of dust into the housing 39.

Figure 9:
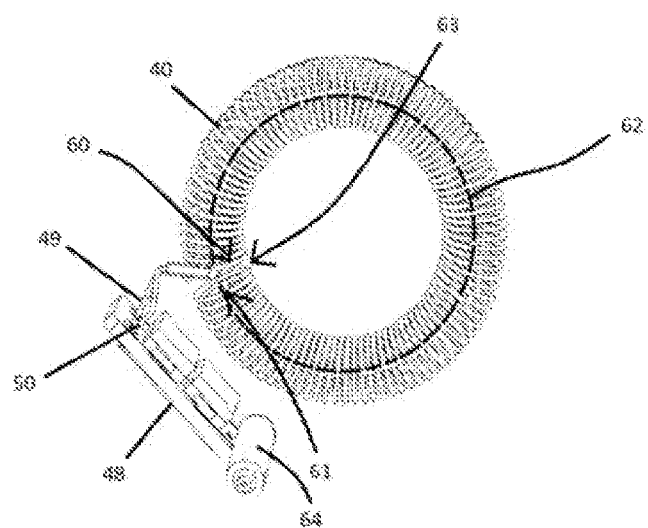
FIG. 9 is a perspective view of the coil of the current measurement sensor.

Furthermore, as shown in FIG. 9, the coil 40 is formed by a wire with two terminals 49, 50 that are electrically connected to the printed circuit 48. The coil 40 has a helical portion in the shape of an incomplete torus that extends between a first end 60 and a second end 61. In addition, from the second end 61, the coil 40 comprises a return portion 62, schematically shown as dashed lines in FIG. 9, which passes inside the turns of the helical portion to the first end 60. Thus, the two terminals 49, 50 of the coil 40 project towards the printed circuit from the first end 60 of the helical portion. The helical portion therefore has an incomplete toroidal shape and the coil 40 has a space 63 provided between the two ends 60, 61 of the helical portion that allows passage of the portion 35 of the busbar 37. This allows the coil 40 to be disposed around the whole of the busbar portion 35. The return portion 32 is advantageously covered with an insulating sheath to avoid disrupting the current measurement. In addition, the first part 37 of the casing 14 comprises a wall 67 that is positioned in the housing 39 between the two ends 60, 61 of the helical portion of the coil 40 and prevents them from touching.

Furthermore, the current measurement toroid 11 comprises a connector 64, which, on the one hand, is electrically connected to the printed circuit 48 and, on the other hand, is connected to a cable, not shown. The connector 64 passes through a hole 65 provided in the second part 38 of the annular support 36. The cable connected to said connector 64 is connected to an external connector 66, shown in FIGS. 2, 3 and 5, for example, via a printed circuit.

The external connector 64 is intended to accommodate a cable connected to an external monitoring device 13 in order to transmit the voltage signal delivered by the current measurement toroid 11 to said monitoring device 13.

Even though the invention has been described with reference to several particular embodiments, it is clear that it is by no means limited thereto and that it comprises all the technical equivalents of the means described, as well as their combinations, if they fall within the scope of the invention.

The use of the verbs "comprise" or "include" and their conjugated forms does not exclude the presence of elements or steps other than those described in a claim.

In the claims, any reference sign between brackets must not be interpreted as being a limitation of the claim.

The invention claimed is:

1. Surge protection device intended to be installed on an electrical installation, in parallel with one or more items of equipment to be protected, said electrical installation comprising at least one first phase line (L1), a neutral line (N) and an earth line (T), the protection device comprising:
   a casing;
   at least one first and one second busbar, which are housed in the casing;
   at least one first and one second connection terminal, which are housed in the casing and are respectively connected to the first and the second busbars and are respectively intended to be connected to the neutral line (N) and the earth line (T) of the electrical installation;
   at least one first protection module connecting the first busbar and the second busbar, the first protection module being configured to divert a surge current from the neutral line (N) to the earth line (T), or vice versa; and
   a current measurement toroid, which is housed in the casing and which comprises a central opening, through which a detection portion passes that forms part of one from among the first and the second busbars, said detection portion being disposed in a surge current diversion path running from the first connection terminal to the second connection terminal,
   wherein the current measurement toroid comprises an annular support defining an annular housing, around the central opening, and a coil housed in the housing of the annular support.

2. Surge protection device according to claim 1, wherein the detection portion forms part of the first busbar.

3. Surge protection device according to claim 1, wherein the current measurement toroid comprises a Rogowski coil.

4. Surge protection device according to claim 1, further comprising:
   a third busbar, which is housed in the casing;
   a third connection terminal, which is housed in the casing, is connected to the third busbar and is intended to be connected to the first phase line (L1) of the electrical installation; and
   a second protection module connecting the third busbar to the first busbar, the second protection module being configured to divert a surge current from the first phase line (L1) to the earth line (T) or to the neutral line (N), or vice versa.

5. Surge protection device according to claim 1, wherein the annular support comprises a first part and a second part attached together by attachment components, the first and second parts respectively comprising a first slot and a second slot dimensioned to allow the passage of the detection portion.

6. Surge protection device according to claim 5, wherein the first part comprises an annular bottom and an outer wall and an inner wall projecting from the bottom towards the second part, the inner wall and the outer wall defining, with the bottom, the housing, the first slot passing through the bottom, the outer wall and the inner wall, the second part comprising an annular flange covering the housing, the second slot passing through the annular flange.

7. Surge protection device according to claim 6, wherein the annular flange comprises two lugs, which project from said annular flange towards the first part and which respectively insert into portions of the first slot that are provided in the inner wall and in the outer wall of the first part.

8. Surge protection device according to claim 5, wherein the first slot and the second slot are angularly offset from each other.

9. Surge protection device according to claim 1, wherein the coil is formed by a wire successively forming a first terminal, an incomplete toroidal helical portion extending between a first end and a second end separated from each other by a space allowing the passage of the detection portion, a return portion, which extends from the second end of the helical portion and passes inside the helical portion to the first end of said helical portion and a second terminal.

10. Surge protection device according to claim 9, wherein the annular support comprises a wall positioned in the housing between the first end and the second end of the helical portion of the coil.

11. Surge protection device according to claim 9, wherein the return portion is housed in an insulating sheath.

12. Surge protection device according to claim 1, wherein the first busbar is connected to the first protection module by a soldered joint.

13. Protection device according to claim 4, further comprising a fourth and a fifth busbar housed in the casing and a fourth and a fifth connection terminal, which are respectively connected to the fourth and to the fifth busbars and are respectively intended to be electrically connected to a second and a third phase line (L2, L3), the device further comprising a third and a fourth protection module, the third protection module connecting the fourth busbar to the first busbar and the fourth protection module connecting the fifth busbar to the first busbar, the fourth and the fifth protection modules respectively being configured to divert a surge current from the second phase line (L2) to the earth line (T) or the neutral line (N) and from the third phase line (L3) to the earth line (T) or the neutral line (N), or vice versa.

14. Surge protection device according to claim 1, wherein the casing comprises a front part equipped with an external connector, which is connected to the current measurement toroid.

15. Surge protection device intended to be installed on an electrical installation, in parallel with one or more items of equipment to be protected, said electrical installation comprising at least one first phase line (L1), a neutral line (N) and an earth line (T), the protection device comprising:
   a casing;
   at least one first and one second busbar, which are housed in the casing;
   at least one first and one second connection terminal, which are housed in the casing and are respectively connected to the first and the second busbars and are respectively intended to be connected to the neutral line (N) and the earth line (T) of the electrical installation;
   at least one first protection module connecting the first busbar and the second busbar, the first protection module being configured to divert a surge current from the neutral line (N) to the earth line (T), or vice versa;
   a current measurement toroid, which is housed in the casing and which comprises a central opening, through which a detection portion passes that forms part of one from among the first and the second busbars, said detection portion being disposed in a surge current diversion path running from the first connection terminal to the second connection terminal,
   wherein the coil comprises a first terminal and a second terminal, which are connected to a printed circuit that is housed in a space provided in the annular support.

16. Surge protection device intended to be installed on an electrical installation, in parallel with one or more items of equipment to be protected, said electrical installation comprising at least one first phase line (L1), a neutral line (N) and an earth line (T), the protection device comprising:
  a casing;
  at least one first and one second busbar, which are housed in the casing;
  at least one first and one second connection terminal, which are housed in the casing and are respectively connected to the first and the second busbars and are respectively intended to be connected to the neutral line (N) and the earth line (T) of the electrical installation;
  at least one first protection module connecting the first busbar and the second busbar, the first protection module being configured to divert a surge current from the neutral line (N) to the earth line (T), or vice versa;
  a current measurement toroid, which is housed in the casing and which comprises a central opening, through which a detection portion passes that forms part of one from among the first and the second busbars, said detection portion being disposed in a surge current diversion path running from the first connection terminal to the second connection terminal,
  the surge protection device further comprising:
    a third busbar, which is housed in the casing;
    a third connection terminal, which is housed in the casing, is connected to the third busbar and is intended to be connected to the first phase line (L1) of the electrical installation; and
    a second protection module connecting the third busbar to the first busbar, the second protection module being configured to divert a surge current from the first phase line (L1) to the earth line (T) or to the neutral line (N), or vice versa,
  wherein the casing comprises a front part and a rear part, the rear part comprising attachment elements, configured to attach the surge protection device to a cabinet of the electrical installation that is equipped with a busbar comprising at least three busbars respectively connected to the first phase line (L1), to the neutral line (N) and to the earth line (T), the rear part comprising openings each accommodating one of the first, second and third connection terminals so as to allow each of said first, second and third connection terminals to be pressed against one of the busbars.

17. Assembly comprising a surge protection device and a monitoring device, which is connected by a cable to the external connector of the surge protection device, the monitoring device being configured to process a signal delivered by the current measurement toroid and to deliver one or more items of surge-related information selected from the number, the amplitude, the duration and the time of surge currents diverted by the surge protection device,
  the surge protection device being device intended to be installed on an electrical installation, in parallel with one or more items of equipment to be protected, said electrical installation comprising at least one first phase line (L1), a neutral line (N) and an earth line (T), the protection device comprising:
    a casing;
    at least one first and one second busbar, which are housed in the casing;
    at least one first and one second connection terminal, which are housed in the casing and are respectively connected to the first and the second busbars and are respectively intended to be connected to the neutral line (N) and the earth line (T) of the electrical installation;
    at least one first protection module connecting the first busbar and the second busbar, the first protection module being configured to divert a surge current from the neutral line (N) to the earth line (T), or vice versa;
    a current measurement toroid, which is housed in the casing and which comprises a central opening, through which a detection portion passes that forms part of one from among the first and the second busbars, said detection portion being disposed in a surge current diversion path running from the first connection terminal to the second connection terminal,
  wherein the casing comprises a front part equipped with an external connector, which is connected to the current measurement toroid.

* * * * *